US007761891B2

(12) United States Patent
Sahasrabudhe et al.

(10) Patent No.: US 7,761,891 B2
(45) Date of Patent: Jul. 20, 2010

(54) ASSIGNING CHANNEL SELECTION TIME INTERVALS BY BROADCAST REGION

(75) Inventors: Rajeev Madhukar Sahasrabudhe, Fishers, IN (US); Herve Dartigues, Paris (FR); Jacques Mingot, Noisy le Roi (FR)

(73) Assignee: Thomson Licensing, Boulogne-Billacourt (FR)

( * ) Notice: Subject to any disclaimer, the term of this patent is extended or adjusted under 35 U.S.C. 154(b) by 631 days.

(21) Appl. No.: 10/552,559

(22) PCT Filed: Apr. 7, 2004

(86) PCT No.: PCT/US2004/010643

§ 371 (c)(1),
(2), (4) Date: Oct. 11, 2005

(87) PCT Pub. No.: WO2004/093437

PCT Pub. Date: Oct. 28, 2004

(65) Prior Publication Data

US 2006/0288364 A1 Dec. 21, 2006

(30) Foreign Application Priority Data

Apr. 11, 2003 (EP) .................................. 03290905

(51) Int. Cl.
*G06F 3/00* (2006.01)
*G06F 13/00* (2006.01)
*H04N 5/445* (2006.01)
*H04N 5/50* (2006.01)

(52) U.S. Cl. ........................................ 725/38; 348/731

(58) Field of Classification Search .................... 725/38, 725/57; 348/731–733
See application file for complete search history.

(56) References Cited

U.S. PATENT DOCUMENTS 5,483,685 A * 1/1996 Okamura .................. 455/179.1
6,002,394 A * 12/1999 Schein et al. ................. 725/39

FOREIGN PATENT DOCUMENTS

| JP | 07007680 A | 1/1995 |
| JP | 2001-128077 | 10/1999 |
| JP | 2001-16516 A | 1/2001 |

OTHER PUBLICATIONS

Patent Abstract of Japan Patent 09083302; Mar. 28, 1997; Matsushita Electric Ind Co Ltd. and Japanese Patent 9-83302.
Japan Abstract 09083302; Mar. 28, 1997; Matsushita Electric Ind Co Ltd.; 2 pages.
Japan Abstract of 2001016516: Jan. 19, 2001; Victor Co. of Japan Ltd: 5 pages.
Search Report dated Oct. 11, 2004.

* cited by examiner

*Primary Examiner*—Scott Beliveau
*Assistant Examiner*—Bennett Ingvoldstad
(74) *Attorney, Agent, or Firm*—Robert D. Shedd; Joseph J. Opalach; Brian J. Cromarty

(57) ABSTRACT

A method for selecting a broadcast program is conducive for worldwide or global use. According to an exemplary embodiment, the method includes steps of receiving a first user input representing a first digit associated with the broadcast program, storing first data representing the first digit within one of a first predetermined time interval for a first region and a second predetermined time interval for a second region, and processing the first data for selecting the broadcast program.

18 Claims, 4 Drawing Sheets

ASSIGNING CHANNEL SELECTION TIME INTERVALS BY BROADCAST REGION

This application claims the benefit, under 35 U.S.C. §365 of International Application PCT/US04/10643, filed Apr. 7, 2004, which was published in accordance with PCT Article 21(2) on Oct. 28, 2004 in English and which claims the benefit of European patent application No. 03290905.3, filed Apr. 11, 2003.

The present invention generally relates to a technique for selecting broadcast programs, and more particularly, to a method and apparatus for selecting broadcast programs that is conducive for worldwide or global use.

In conventional products, such as television signal receivers, a tuner incorporated therein may require users to select a broadcast program by inputting (e.g., via a remote control device) one or more digits representing a channel/program number. Although it is a very rudimentary task, the selection of a broadcast program is very important since it is a task that users perform virtually every day. Accordingly, it is desirable that the task of selecting a broadcast program be simple for users to understand and perform. In geographical regions such as North America (e.g., the United States and Canada) and South America, the digits input by a user to select a broadcast program may be referred to as a channel number, while in other geographical regions such as Europe and Asia, these digits may be referred to as a program number. As referred to herein, however, the terms "channel" and "program" may be used interchangeably.

User perceptions and interaction methods concerning broadcast channel/program selection may vary greatly in different regions of the world due to inherent differences in culture and/or available broadcast programming. For example, in North America and South America, satellite and cable television service providers frequently offer more than 100 channels/programs, as opposed to countries in Europe and Asia where broadcasts with less than 10 channels/programs are popular. Due to such differences, the same techniques for selecting broadcast programs, as they exist today, are not used on a worldwide or global basis since such differences tend to create different user perceptions and interaction methods concerning broadcast channel/program selection.

The lack of a technique for selecting broadcast channels/programs that is conducive for use on a worldwide or global basis is problematic for various reasons. In particular, it requires consumer electronics manufacturers to develop multiple versions of software (i.e., one for each individual region) for enabling channel/program selection. Since user interaction methods for selecting broadcast channels/programs in different regions may differ significantly, a significant amount of resources may be dedicated for the development of these different versions of software. The requirement of multiple (and perhaps significantly different) versions of such software in turn increases product development costs, which is generally disadvantageous for product manufacturers and/or consumers.

Accordingly, there is a need for a method and apparatus for selecting broadcast programs that addresses the foregoing problems, and is thereby conducive for use on a worldwide or global basis.

In accordance with an aspect of the present invention, a method for selecting a broadcast program is disclosed. According to an exemplary embodiment, the method comprises steps of receiving a first user input representing a first digit associated with the broadcast program, storing first data representing the first digit within one of a first predetermined time interval for a first region and a second predetermined time interval for a second region, and processing the first data for selecting the broadcast program.

In accordance with another aspect of the present invention, an apparatus is disclosed. According to an exemplary embodiment, the apparatus comprises tuning means for tuning a frequency providing a broadcast program. Memory means store first data representing a first digit associated with the broadcast program responsive to a first user input. The memory means stores the first data within one of a first predetermined time interval for a first region and a second predetermined time interval for a second region. Processing means process the first data and control the tuning means to select the broadcast program.

In accordance with still another aspect of the present invention, a television signal receiver is disclosed. According to an exemplary embodiment, the television signal receiver comprises a tuner operative to tune a frequency providing a broadcast program. A memory is operative to store first data representing a first digit associated with the broadcast program responsive to a first user input. The memory stores the first data within one of a first predetermined time interval for a first region and a second predetermined time interval for a second region. A processor is operative to process the first data and control the tuner to select the broadcast program.

In accordance with yet another aspect of the present invention, another method for selecting a broadcast program is disclosed. According to an exemplary embodiment, the method comprises steps of receiving a first user input representing a first digit associated with the broadcast program, receiving a second user input representing a second digit associated with the broadcast program, processing data corresponding to the first and second user inputs to select the broadcast program if the second digit is in a first set of digits, and waiting for a third user input representing a third digit associated with the broadcast program without selecting the broadcast program if the second digit is in a second set of digits, wherein the first set of digits is different from the second set of digits.

In accordance with still yet another aspect of the present invention, another apparatus is disclosed. According to an exemplary embodiment, the apparatus comprises tuning means for tuning frequencies providing broadcast programs. Processing means detect a first user input representing a first digit associated with a broadcast program and a second user input representing a second digit associated with the broadcast program. The processing means processes data corresponding to the first and second user inputs to select the broadcast program if the second digit is in a first set of digits. The processing means waits for a third user input representing a third digit associated with the broadcast program without selecting the broadcast program if the second digit is in a second set of digits. The first set of digits is different from the second set of digits.

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

Figure 1:
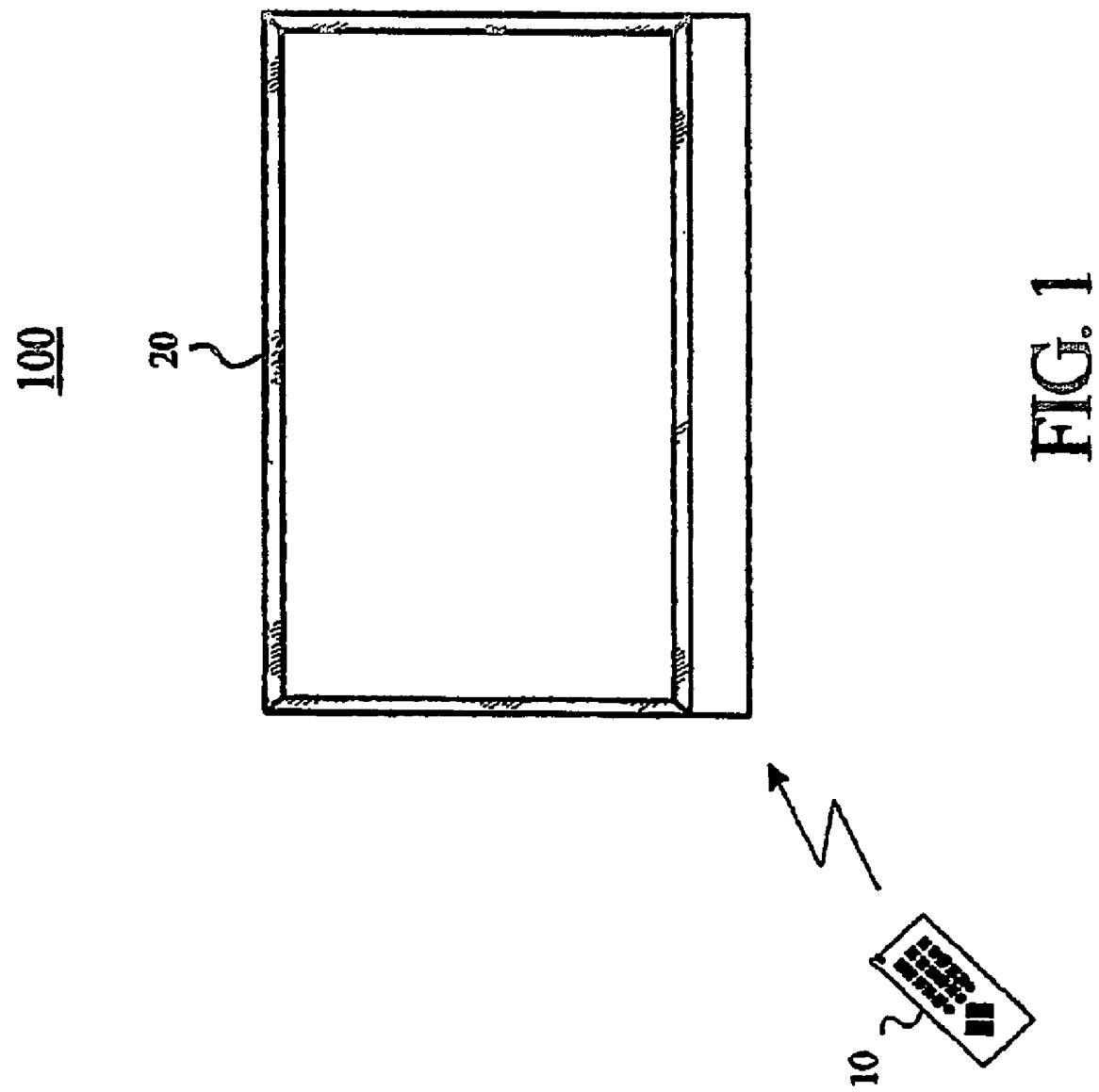
FIG. 1 is an exemplary environment suitable for implementing the present invention.

Referring now to the drawings, and more particularly to FIG. 1, an exemplary environment 100 suitable for implementing the present invention is shown. As indicated in FIG. 1, environment 100 comprises user input means such as user input device 10, and channel/program receiving means such as apparatus 20.

User input device 10 is operative to generate and output control signals that control the operation of apparatus 20 and/or other devices. According to an exemplary embodiment, user input device 10 includes a plurality of input keys and outputs control signals in a wired and/or wireless (e.g., via infrared or radio frequency link, etc.) manner responsive to user depression of its input keys. The control signals output from user input device 10 may for example represent one or more digits of a channel/program number, and/or other commands that control apparatus 20. User input device 10 may for example be embodied as a hand-held remote control device, wired and/or wireless keyboard, or other user input device.

Apparatus 20 is operative to receive broadcast channels/programs (e.g., television programs, radio programs, etc.) provided from one or more broadcast sources such as terrestrial, cable, satellite, internet and/or other broadcast sources responsive to user inputs via user input device 10. According to an exemplary embodiment, apparatus 20 is embodied as a television signal receiver, but may be embodied as any device or apparatus such as a radio having a broadcast channel/program receiving function.

Figure 2:
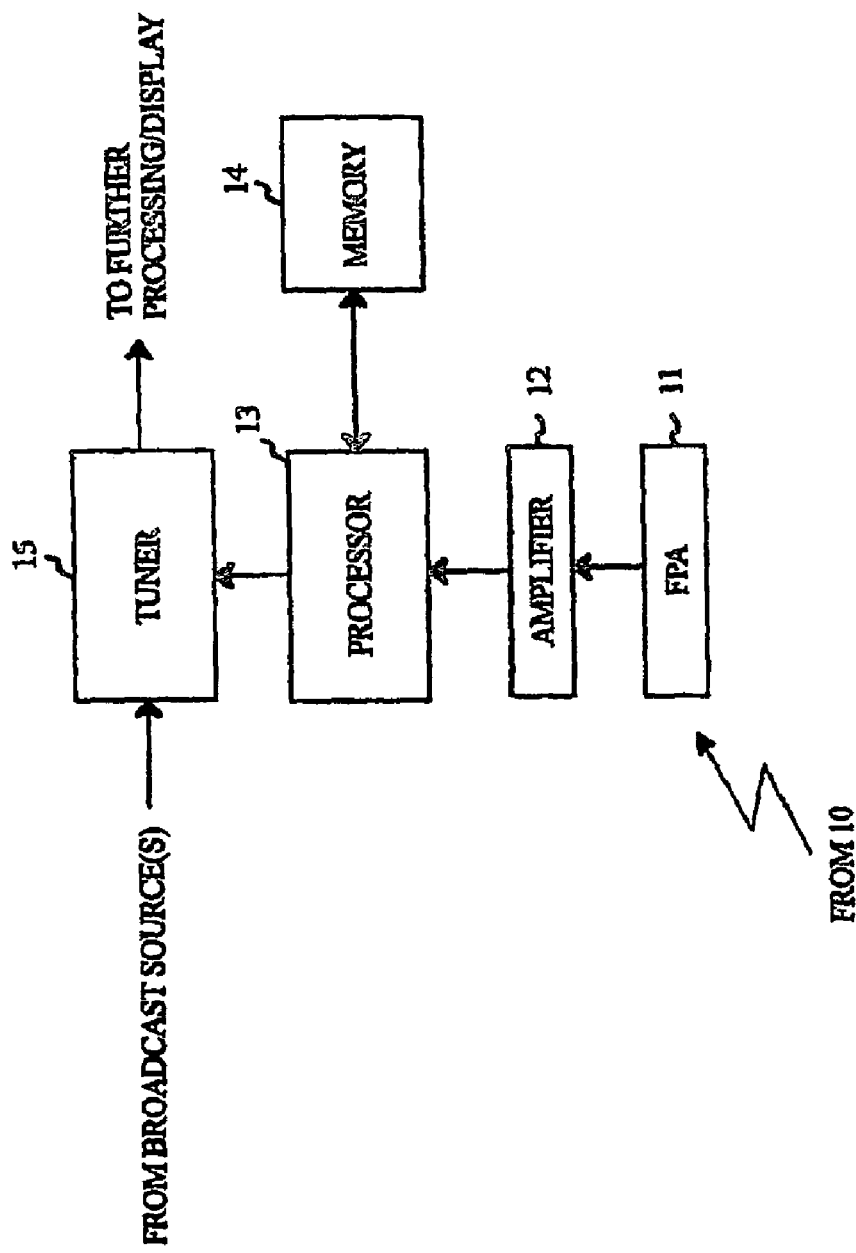
FIG. 2 is a block diagram providing further details of the apparatus of FIG. 1 according to an exemplary embodiment of the present invention.

Referring to FIG. 2, a block diagram providing further details of apparatus 20 of FIG. 1 according to an exemplary embodiment of the present invention is shown. Apparatus 20 of FIG. 2 comprises front panel means such as front panel assembly (FPA) 11, amplifying means such as amplifier 12, processing means such as processor 13, memory means such as memory 14, and tuning means such as tuner 15. Some of the foregoing elements of FIG. 2 may be embodied using integrated circuits (ICs), and some elements may for example be included on one or more ICs. For clarity of description, certain conventional elements associated with apparatus 20 such as certain control signals, power signals and/or other elements may not be shown in FIG. 2.

FPA 11 is operative to receive user inputs from user input device 10, and to output signals corresponding to the user inputs to amplifier 12. According to an exemplary embodiment, FPA 11 receives wireless signals, such as IR and/or RF signals, from remote control device 10 and generates corresponding signals which are output to amplifier 12. Amplifier 12 is operative to amplify the signals provided from FPA 11 for output to processor 13.

Processor 13 is operative to perform various signal processing functions of apparatus 20. According to an exemplary embodiment, processor 13 may execute software code representing algorithms which enable channel/program selection according to the present invention. According to this exemplary embodiment, processor 13 is operative to detect user inputs provided via user input device 10, process data corresponding to such inputs, and may control apparatus 20 and/or other devices responsive to such inputs. For example, processor 13 may generate and output control signals which control tuner 15 responsive to user inputs provided via user input device 10. Processor 13 is also operative to control and monitor various timers, and enable various displays used for channel/program selection according to the present invention.

Memory 14 is operative to perform data storage functions of apparatus 20. According to an exemplary embodiment, memory 14 stores data including software code representing channel/program selection algorithms executed by processor 13. Memory 14 may also store other data including data corresponding to user inputs (e.g., channel/program digits, user setup data for apparatus 20, etc.) provided via user input device 10.

According to an exemplary embodiment, a user setup process of apparatus 20 may allow a user to input user setup data including an applicable region and/or broadcast source for apparatus 20. The applicable region for apparatus 20 may for example refer to a geographical region (e.g., Europe, Asia, North America, South America, etc.), and/or a service provider region. Here, a "service provider region" may for example refer to a region which receives broadcast programs from a particular service provider (e.g., a particular internet service provider, cable service provider, satellite service provider, etc.). The applicable broadcast source for apparatus 20 may refer to a type of broadcast source (e.g., cable, terrestrial, satellite, internet, etc.) from which apparatus 20 will receive broadcast programs. As will be described later herein, broadcast program selection may be performed differently according to the present invention depending upon the applicable region and/or broadcast source for apparatus 20. For example, different predetermined time intervals may be used when performing broadcast program selection depending upon the applicable region and/or broadcast source for apparatus 20. Data indicating the applicable region and/or broadcast source for apparatus 20 may also be stored in memory 14 during the manufacture of apparatus 20.

Tuner 15 is operative to tune frequencies that provide signals including audio, video and/or data signals representing broadcast programs (e.g., television programs, radio programs, etc.) provided from one or more broadcast sources such as terrestrial, cable, satellite, internet and/or other broadcast sources. According to an exemplary embodiment, tuner 15 selectively tunes such frequencies responsive to control signals provided from processor 13.

Figure 3:
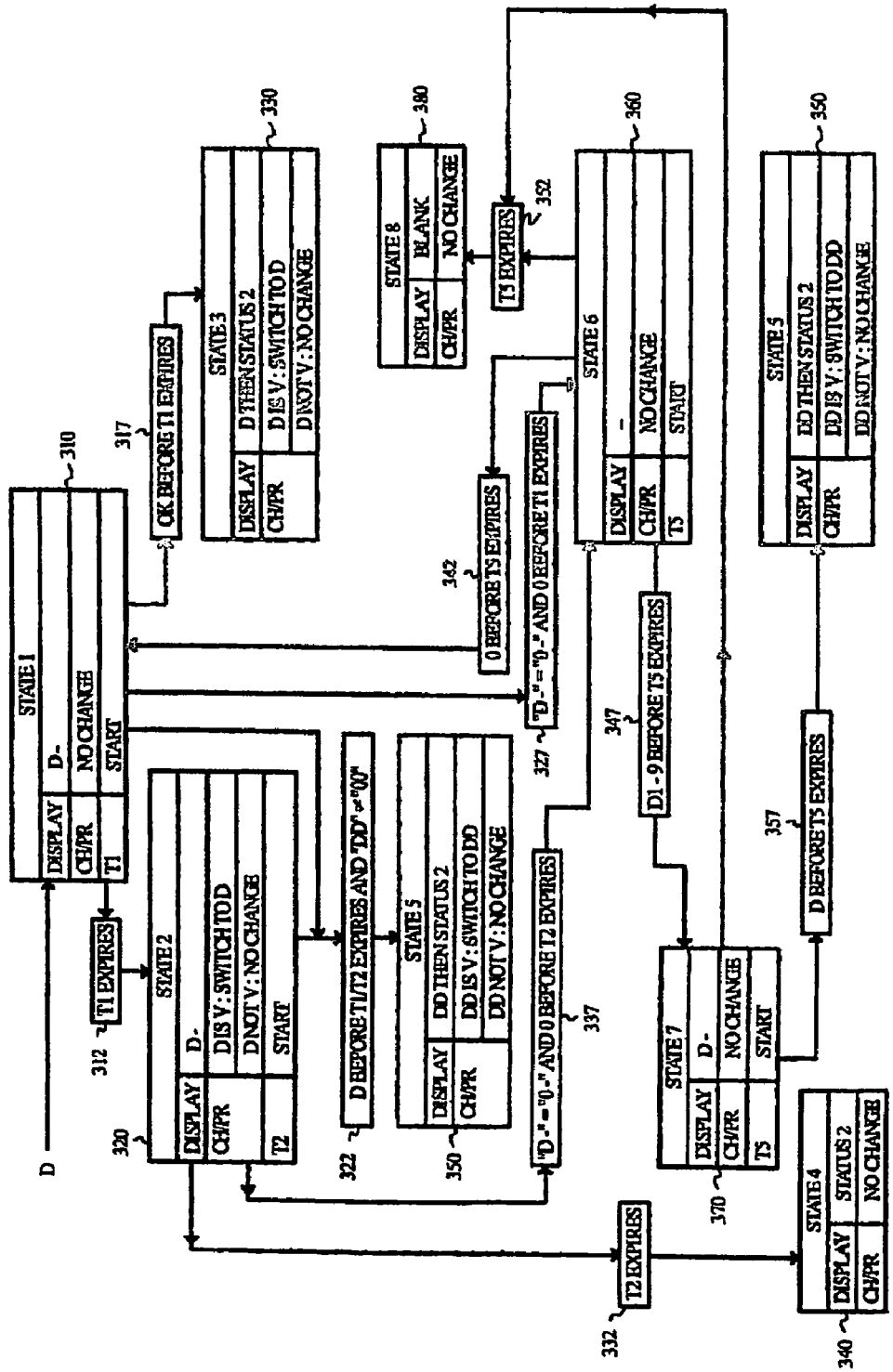
FIG. 3 is a diagram representing a broadcast program selection technique according to one aspect of the present invention.

Referring now to FIG. 3, a diagram 300 representing a broadcast program selection technique according to one aspect of the present invention is shown. In particular, diagram 300 illustrates different states and user interactions associated with a broadcast program selection technique that may be used for 1-digit and/or 2-digit channel/program numbers. The broadcast program selection technique of FIG. 3 may for example be used for terrestrial broadcasts in regions such as North America, South America, Europe and Asia, cable broadcasts in regions such as North America and South America, as well as other types of broadcasts such as internet broadcasts in various regions of the world. As previously indicated herein, users may select an applicable region such as a geographical region and/or a service provider region during a setup process for apparatus 20. For purposes of example and explanation, FIG. 3 will be described with reference to apparatus 20 of FIGS. 1 and 2.

In FIG. 3, various abbreviations may be used as follows:

CH/PR represents broadcast channel/program.

T1 represents a predetermined time interval. According to an exemplary embodiment, T1 may represent a first predetermined time interval (e.g., 1 second, etc.) that may be used for a first region (e.g., Europe/Asia, first service provider region, etc.), and/or a longer, second predetermined time interval (e.g., 1.5 seconds, etc.) that may be used for a second region (e.g., North America/South America, second service provider region, etc.).

T2 represents another predetermined time interval (e.g., 1.5 seconds, etc.).

T5 represents still another predetermined time interval (e.g., 5 seconds, etc.).

D represents a digit (e.g., DX-Y represents digits X to Y).

Status 2 represents a display state which provides a CH/PR number and/or CH/PR name.

V represents valid. According to an exemplary embodiment, a CH/PR and/or its number may be considered valid if it is different from a current CH/PR, different from the digit 0, in the CH/PR range of 1 through 99 for broadcasts in certain regions (e.g., Europe/Asia, certain service provider regions, etc.), in the CH/PR range of 2 through 69 for terrestrial broadcasts in certain regions (e.g., North America/South America, certain service provider regions, etc.), and/or in the CH/PR range of 1 through 125 for cable broadcasts in certain regions (e.g., North America/South America, certain service provider regions, etc.). Other conditions may also be used when considering validity.

In FIG. 3, broadcast program selection begins when a user inputs a first digit D via user input device 10, thereby creating state 1 represented by reference numeral 310. At state 1 in FIG. 3, apparatus 20 provides a display "D-" under the control of processor 13, but no change to the current CH/PR occurs. Also at state 1 in FIG. 3, processor 13 starts predetermined time interval T1, and data corresponding to the first digit D is stored in memory 14 within this predetermined time interval T1 under the control of processor 13. In FIG. 3, a first predetermined time interval such as 1 second or other time interval may for example be used for time interval T1 in a first region (e.g., Europe/Asia, first service provider region, etc.), or a longer, second predetermined time interval such as 1.5 seconds or other time interval may for example be used for time interval T1 in a second region (e.g., North America/South America, second service provider region, etc.). All time intervals referred to herein are presumed to be positive (i.e., non-zero) time intervals.

From state 1 in FIG. 3, process flow may advance to state 2 represented by reference numeral 320. Process flow advances from state 1 to state 2 in FIG. 3 if predetermined time interval T1 expires before processor 13 detects another user input, as represented by reference numeral 312. At state 2 in FIG. 3, apparatus 20 continues to provide the display "D-" and processor 13 makes a determination as to whether the CH/PR number represented by first digit D is valid in the manner previously described herein. If the CH/PR number represented by first digit D is valid, processor 13 outputs a control signal to tuner 15 to thereby switch the current CH/PR to CH/PR D. Conversely, if the CH/PR number represented by first digit D is invalid, no change to the current CH/PR occurs. Also at state 2 in FIG. 3, processor 13 starts another predetermined time interval T2. In FIG. 3, a predetermined time interval such as 1.5 seconds or other time interval may for example be used for time interval T2.

From state 1 in FIG. 3, process flow may also advance to state 3 represented by reference numeral 330. Process flow advances from state 1 to state 3 in FIG. 3 if processor 13 detects the user input an "OK" key of user input device 10 before predetermined time period T1 expires, as represented by reference numeral 317. At state 3 in FIG. 3, apparatus 20 temporarily provides the display "D" and then switches to the status 2 display as previously described herein under the control of processor 13. Also at state 3 in FIG. 3, processor 13 makes a determination as to whether the CH/PR number represented by first digit D is valid in the manner previously described herein. If the CH/PR number represented by first digit D is valid, processor 13 outputs a control signal to tuner 15 to thereby switch the current CH/PR to CH/PR D. Conversely, if the CH/PR number represented by first digit D is invalid, no change to the current CH/PR occurs.

From state 1 in FIG. 3, process flow may also advance to state 5 represented by reference numeral 350. Process flow advances from state 1 to state 5 in FIG. 3 if processor 13 detects the user input a second digit D via user input device 10 before predetermined time period T1 expires and first and second digits DD are not 00, as represented by reference numeral 322. At state 5 in FIG. 3, apparatus 20 temporarily provides the display "DD" and then switches to the status 2 display as previously described herein under the control of processor 13. Also at state 5 in FIG. 3, processor 13 makes a determination as to whether the CH/PR number represented by first and second digits DD is valid in the manner previously described herein. If the CH/PR number represented by first and second digits DD is valid, processor 13 outputs a control signal to tuner 15 to thereby switch the current CH/PR to CH/PR DD. Conversely, if the CH/PR number represented by first and second digits DD is invalid, no change to the current CH/PR occurs.

From state 1 in FIG. 3, process flow may also advance to state 6 represented by reference numeral 360. Process flow advances from state 1 to state 6 in FIG. 3 if first digit D is 0 and processor 13 detects the user input a second 0 digit via user input device 10 before predetermined time period T1 expires, as represented by reference numeral 327. At state 6 in FIG. 3, apparatus 20 provides the display "--" under the control of processor 13, and no change to the current CH/PR occurs. Also at state 6 in FIG. 3, processor 13 starts another predetermined time interval T5. In FIG. 3, a predetermined time interval such as 5 seconds or other time interval may for example be used for time interval T5.

From state 2 in FIG. 3, process flow may advance to state 4 as represented by reference numeral 340. Process flow advances from state 2 to state 4 in FIG. 3 if predetermined time interval T2 expires before processor 13 detects another user input, as represented by reference numeral 332. At state 4 in FIG. 3, apparatus 20 provides the status 2 display as previously described herein, and no change to the current CH/PR occurs.

From state 2 in FIG. 3, process flow may also advance to state 6 as previously described herein. Process flow advances from state 2 to state 6 in FIG. 3 if first digit D is 0 and processor 13 detects the user input a second 0 digit via user input device 10 before predetermined time period T2 expires, as represented by reference numeral 337.

From state 6 in FIG. 3, process flow may advance to state 1 as previously described herein. Process flow advances from state 6 to state 1 in FIG. 3 if the user inputs the digit 0 via user input device 10 before predetermined time period T5 expires, as represented by reference numeral 342.

From state 6 in FIG. 3, process flow may also advance to state 7 represented by reference numeral 370. Process flow advances from state 6 to state 7 in FIG. 3 if processor 13 detects the user input a digit D of 1 through 9 via user input device 10 before predetermined time period T5 expires, as represented by reference numeral 347. At state 7 in FIG. 3, apparatus 20 provides a display "D-" under the control of processor 13, but no change to the current CH/PR occurs. Also at state 7 in FIG. 3, processor 13 starts predetermined time interval T5.

From state 6 in FIG. 3, process flow may also advance to state 8 as represented by reference numeral 380. Process flow advances from state 6 to state 8 in FIG. 3 if predetermined time period T5 expires before processor 13 detects another user input, as represented by reference numeral 352. At state 8 in FIG. 3, apparatus 20 provides a blank display under the control of processor 13, and no change to the current CH/PR occurs.

From state 7 in FIG. 3, process flow may advance to state 5, as previously described herein. Process flow advances from state 7 to state 5 in FIG. 3 if processor 13 detects the user input another digit D before predetermined time period T5 expires, as represented by reference numeral 357.

From state 7 in FIG. 3, process flow may also advance to state 8, as previously described herein. Process flow advances from state 7 to state 8 in FIG. 3 if predetermined time period T5 expires before processor 13 detects another user input, as represented by reference numeral 352.

Figure 4:
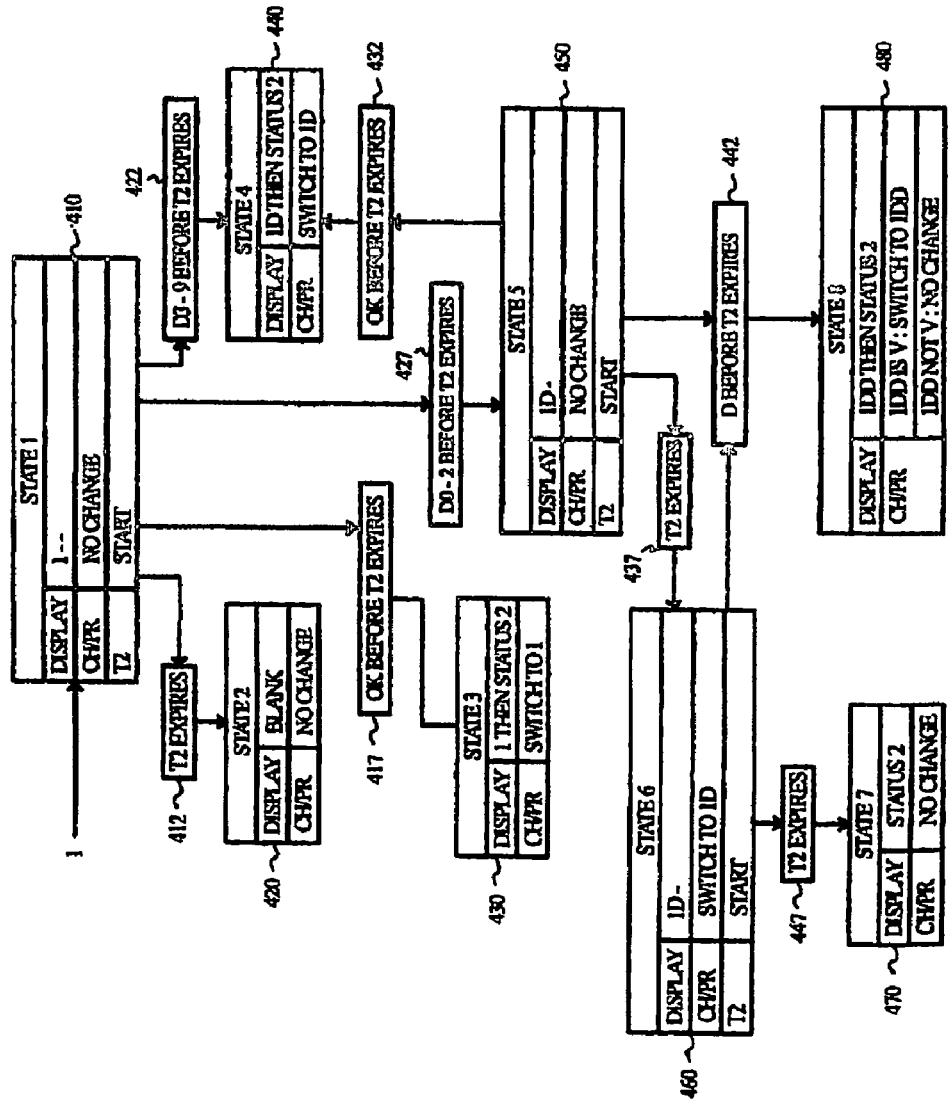
FIG. 4 is a diagram representing a broadcast program selection technique according to another aspect of the present invention.

Referring now to FIG. 4, a diagram 400 representing a broadcast program selection technique according to another aspect of the present invention is shown. In particular, diagram 400 illustrates different states and user interactions associated with a broadcast program selection technique that may be used for 1-digit, 2-digit and/or 3-digit channel/program numbers. For purposes of example and explanation, it is assumed in FIG. 4 that the first input digit is 1, although it will be intuitive to those skilled in the art that the principles reflected in FIG. 4 may also be used if the first input digit is not 1. The broadcast program selection technique of FIG. 4 may for example be used for cable broadcasts in regions such as North America and South America, as well as other types of broadcasts such as internet broadcasts in various regions of the world. FIG. 4 also uses many of the same abbreviations used in FIG. 3, as previously described herein. Also for purposes of example and explanation, FIG. 4 will be described with reference to apparatus 20 of FIGS. 1 and 2.

In FIG. 4, broadcast program selection begins when a user inputs the digit 1 via user input device 10, thereby creating state 1 represented by reference numeral 410. At state 1 in FIG. 4, apparatus 20 provides a display "1--" under the control of processor 13, but no change to the current CH/PR occurs. Also at state 1 in FIG. 4, processor 13 starts predetermined time interval T2, and data corresponding to the digit 1 is stored in memory 14 within this predetermined time interval T2 under the control of processor 13. In FIG. 4, a predetermined time interval such as 1.5 seconds or other time interval may for example be used for time interval T2.

From state 1 in FIG. 4, process flow may advance to state 2 represented by reference numeral 420. Process flow advances from state 1 to state 2 in FIG. 4 if predetermined time interval T2 expires before processor 13 detects another user input, as represented by reference numeral 412. At state 2 in FIG. 4, apparatus 20 provides a blank display under the control of processor 13, and no change to the current CH/PR occurs.

From state 1 in FIG. 4, process flow may also advance to state 3 represented by reference numeral 430. Process flow advances from state 1 to state 3 in FIG. 4 if processor 13 detects the user input the "OK" key of user input device 10 before predetermined time period T2 expires, as represented by reference numeral 417. At state 3 in FIG. 4, apparatus 20 temporarily provides the display "1" and then switches to the status 2 display as previously described herein under the control of processor 13. Also at state 3 in FIG. 4, processor 13 outputs a control signal to tuner 15 to thereby switch the current CH/PR to CH/PR 1.

From state 1 in FIG. 4, process flow may also advance to state 4 represented by reference numeral 440. Process flow advances from state 1 to state 4 in FIG. 4 if processor 13 detects the user input a digit D of 3 through 9 via user input device 10 before predetermined time period T2 expires, as represented by reference numeral 422. At state 4 in FIG. 4, apparatus 20 temporarily provides the display "1D" and then switches to the status 2 display as previously described herein under the control of processor 13. Also at state 4 in FIG. 4, processor 13 outputs a control signal to tuner 15 to thereby switch the current CH/PR to CH/PR 1D.

From state 1 in FIG. 4, process flow may also advance to state 5 represented by reference numeral 450. Process flow advances from state 1 to state 5 in FIG. 4 if processor 13 detects the user input a digit D of 0 through 2 via user input device 10 before predetermined time period T2 expires, as represented by reference numeral 427. At state 5 in FIG. 4, apparatus 20 provides the display "1D-" under the control of processor 13, and no change to the current CH/PR occurs. Also at state 5 in FIG. 4, processor 13 again starts predetermined time interval T2.

From state 5 in FIG. 4, process flow may advance to state 4, as previously described herein. Process flow advances from state 5 to state 4 in FIG. 4 if processor 13 detects the user input the "OK" key of user input device 10 before predetermined time period T2 expires, as represented by reference numeral 432.

From state 5 in FIG. 4, process flow may also advance to state 6 represented by reference numeral 460. Process flow advances from state 5 to state 6 in FIG. 4 if predetermined time interval T2 expires before processor 13 detects another user input, as represented by reference numeral 437. At state 6 in FIG. 4, apparatus 20 provides the display "1D" and processor 13 outputs a control signal to tuner 15 to thereby switch the current CH/PR to CH/PR 1D. Also at state 6 in FIG. 4, processor 13 again starts predetermined time interval T2.

From state 5 in FIG. 4, process flow may also advance to state 8 represented by reference numeral 480. Process flow advances from state 5 to state 8 in FIG. 4 if processor 13 detects the user input a digit D via user input device 10 before predetermined time period T2 expires, as represented by reference numeral 442. At state 8 in FIG. 4, apparatus 20 temporarily provides the display "1 DD" and then switches to the status 2 display as previously described herein under the control of processor 13. Also at state 8 in FIG. 4, processor 13 makes a determination as to whether the CH/PR number represented by digits 1DD is valid in the manner previously described herein. If the CH/PR number represented by digits 1DD is valid, processor 13 outputs a control signal to tuner 15 to thereby switch the current CH/PR to CH/PR 1DD. Conversely, if the CH/PR number represented by digits 1DD is invalid, no change to the current CH/PR occurs.

From state 6 in FIG. 4, process flow may advance to state 7 represented by reference numeral 470. Process flow advances from state 6 to state 7 in FIG. 4 if predetermined time interval T2 expires before processor 13 detects another user input, as represented by reference numeral 447. At state 7 in FIG. 4, apparatus 20 provides the status 2 display as previously described herein under the control of processor 13, and no change to the current CH/PR occurs.

From state 6 in FIG. 4, process flow may also advance to state 8 as previously described herein. Process flow advances from state 6 to state 8 in FIG. 4 if processor 13 detects the user input a digit D via user input device 10 before predetermined time period T2 expires, as represented by reference numeral 442.

Numerous variations of the broadcast program selection techniques of FIGS. 3 and 4 may also exist and fall within the scope of the present invention. For example, the CH/PR displays referred to in FIGS. 3 and 4 may be omitted based on design choice.

As described herein, the present invention provides apparatus for selecting broadcast programs that is conducive for worldwide or global use. The geographical regions expressly mentioned herein are examples only, and the present invention may also be applied to other geographical regions. Moreover, the present invention may be applicable to various apparatuses having a channel/program receiving function, either with or without a display device. Accordingly, the phrase "television signal receiver" as used herein may refer to systems or apparatuses including, but not limited to, television sets, radios, computers or monitors that include a display device, and systems or apparatuses such as set-top boxes, video cassette recorders (VCRs), digital versatile disk (DVD) players, radios, video game boxes, personal video recorders (PVRs), computers or other apparatuses that may not include a display device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method for selecting a broadcast program, comprising:
   storing a first time interval associated with a first region and a second predetermined time interval associated with a second region;
   receiving a user selection of one of said first region and said second region;
   storing data corresponding to one of said first region and said second region responsive to said user selection
   receiving a first user input representing a first digit associated with said broadcast program;
   storing first data representing said first digit within one of said first predetermined time interval for said first region in response to said stored data corresponding to said first region and said second predetermined time interval for said second region in response to said stored data corresponding to said second region; and
   processing said first data for selecting said broadcast program, wherein said first predetermined time interval and said second predetermined time interval are non-zero time intervals and wherein said first predetermined time interval is shorter than said second predetermined time interval and said first data is processed after one of said first and second predetermined time intervals expires.

2. The method of claim 1, further comprised of: receiving a second user input representing a second digit associated with said broadcast program within one of said first and second predetermined time intervals; and processing said second data for selecting said broadcast program.

3. The method of claim 1, further comprised of: receiving a second user input representing a second digit associated with said broadcast program within a third predetermined time interval after one of said first and second predetermined time intervals expires; and processing said second data for selecting said broadcast program.

4. The method of claim 1, wherein said first region includes Europe and Asia.

5. The method of claim 1, wherein said second region includes North America and South America.

6. The method of claim 1, wherein: said first region receives first broadcast programs from a first service provider; and said second region receives second broadcast programs from a second service provider.

7. An apparatus, comprising:
   tuning means for tuning a frequency providing a broadcast program;
   memory means for storing a first predetermined time interval associated with a first region and a second predetermined time interval associated with a second region, said memory means further operative to store a user selection indicating one of said first region and said second region, said memory means further operative for storing first data representing a first digit associated with said broadcast program responsive to a first user input, said memory means storing said first data within one of a first predetermined time interval for a first region in response to said user selection indicating said first region and a second predetermined time interval for a second region in response to said user selection indicating said second region; and
   processing means for processing said first data and controlling said tuning means to select said broadcast program, wherein said first predetermined time interval and said second predetermined time interval are non-zero time intervals and wherein said first predetermined time interval is shorter than said second predetermined time interval and said processing means processes said first data after one of said first and second predetermined time intervals expires.

8. The apparatus of claim 7, wherein said processing means: detects a second user input representing a second digit associated with said broadcast program within one of said first and second predetermined time intervals; and processes said second data for selecting said broadcast program.

9. The apparatus of claim 7, wherein said processing means: detects a second user input representing a second digit associated with said broadcast program within a third predetermined time interval after one of said first and second predetermined time intervals expires; and processes said second data for selecting said broadcast program.

10. The apparatus of claim 7, wherein said first region includes Europe and Asia.

11. The apparatus of claim 7, wherein said second region includes North America and South America.

12. The apparatus of claim 7, wherein: said first region receives first broadcast programs from a first service provider; and said second region receives second broadcast programs from a second service provider.

13. A television signal receiver, comprising:
   a tuner operative to tune a frequency providing a broadcast program;
   a memory for storing a first predetermined time interval associated with a first region and a second predetermined time interval associated with a second region, said memory further operative to store a user selection indicating one of said first region and said second region, said memory further operative for storing first data representing a first digit associated with said broadcast program responsive to a first user input, said memory means storing said first data within one of a first predetermined time interval for a first region in response to said user selection indicating said first region and a second predetermined time interval for a second region in response to said user selection indicating said second region; and a processor operative to process said first data and control said tuner to select said broadcast program, wherein said first predetermined time interval and said second predetermined time interval are non-zero time intervals and wherein said first predetermined time interval is shorter than said second predetermined time interval; and said processor processes said first data after one of said first and second predetermined time intervals expires.

14. The television signal receiver of claim 13, wherein said processor is further operative to: detect a second user input representing a second digit associated with said broadcast program within one of said first and second predetermined time intervals; and process said second data to select said broadcast program.

15. The television signal receiver of claim 13, wherein said processor is further operative to: detect a second user input representing a second digit associated with said broadcast program within a third predetermined time interval after one of said first and second predetermined time intervals expires; and process said second data to select said broadcast program.

16. The television signal receiver of claim 13, wherein said first region includes Europe and Asia.

17. The television signal receiver of claim 13, wherein said second region includes North America and South America.

18. The television signal receiver of claim 13, wherein: said first region receives first broadcast programs from a first service provider; and said second region receives second broadcast programs from a second service provider.

* * * * *